(12) United States Patent
Steeves

(10) Patent No.: US 10,566,224 B2
(45) Date of Patent: Feb. 18, 2020

(54) PROTECTING PARTIALLY-PROCESSED PRODUCTS DURING TRANSPORT

(71) Applicant: SKYWORKS SOLUTIONS, INC., Woburn, MA (US)

(72) Inventor: John D Steeves, Conway, SC (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 15/276,806

(22) Filed: Sep. 27, 2016

(65) Prior Publication Data

US 2017/0098586 A1 Apr. 6, 2017

Related U.S. Application Data

(60) Provisional application No. 62/235,769, filed on Oct. 1, 2015.

(51) Int. Cl.
| | |
|---|---|
| *H01L 21/31* | (2006.01) |
| *H01L 21/673* | (2006.01) |
| *H01L 21/683* | (2006.01) |
| *H01L 21/56* | (2006.01) |
| *H01L 21/02* | (2006.01) |

(52) U.S. Cl.
CPC ...... *H01L 21/673* (2013.01); *H01L 21/02334* (2013.01); *H01L 21/56* (2013.01); *H01L 21/563* (2013.01); *H01L 21/566* (2013.01); *H01L 21/568* (2013.01); *H01L 21/67336* (2013.01); *H01L 21/6835* (2013.01); *H01L 21/6836* (2013.01)

(58) Field of Classification Search
CPC . H01L 23/293; H01L 21/561; H01L 21/6835; H01L 21/6836; H01L 21/563; H01L 21/02334; H01L 21/56; H01L 21/566; H01L 21/568; H01L 21/673; H01L 21/67336
USPC ......................................... 483/464, 759, 127
See application file for complete search history.

(56) References Cited

U.S. PATENT DOCUMENTS

| | | | |
|---|---|---|---|
| 2002/0076848 A1* | 6/2002 | Spooner | B81C 1/00888 438/48 |
| 2003/0049437 A1* | 3/2003 | Devaney | C09J 7/0246 428/343 |
| 2008/0023368 A1* | 1/2008 | Soto | H05K 13/0084 206/717 |

(Continued)

*Primary Examiner* — Shouxiang Hu
(74) *Attorney, Agent, or Firm* — Chang & Hale LLP

(57) ABSTRACT

Methods, systems and devices for protecting partially processed electronic parts, are disclosed. In some embodiments, a method for protecting electronic parts includes applying a first protective sheet on one or more partially-processed semiconductor devices, removing the first protective sheet, and performing a semiconductor-processing operation on the one or more partially-processed semiconductor devices. In some embodiments, a semiconductor processing system for protecting electronic parts includes one or more partially-processed semiconductor devices, and a first protective sheet applied on the one or more partially-processed semiconductor devices, the first protective sheet being subsequently removed, and a semiconductor-processing operation being performed on the one or more partially-processed semiconductor devices.

17 Claims, 6 Drawing Sheets

(56) References Cited

U.S. PATENT DOCUMENTS

| | | | | |
|---|---|---|---|---|
| 2008/0026492 A1* | 1/2008 | Richter | ............ | H01L 21/02074 438/17 |
| 2014/0329036 A1* | 11/2014 | Suh | .................... | H05K 13/0084 428/35.2 |
| 2015/0158649 A1* | 6/2015 | Huang | ............... | H05K 13/0084 206/714 |

* cited by examiner ial Application No. 62/235,769 filed Oct. 1, 2015, entitled PROTECTING PARTIALLY PROCESSED PRODUCTS DURING TRANSPORT, the disclosure of which is hereby expressly incorporated by reference herein in its entirety.

BACKGROUND

Field

The present disclosure relates to manufacturing techniques and systems for protecting electronic parts in an intermediate state of processing.

Description of the Related Art

Electronic parts, such as semiconductor devices, are susceptible to various sources of physical damage or environmental contamination while being transported. This susceptibility is much greater before the parts have been completely packaged, or encapsulated. In some cases, electronic parts need to be transported before final packaging to undergo intermediate processing operations. Damage to these unprotected, unpackaged parts can result in time delays and a financial burden to replace defective units. As such, there is a need for a cost effective and efficient technique to protect partially processed electronic parts during transport.

SUMMARY

In accordance with some implementations, the present disclosure relates to a method for protecting electronic parts. The method includes applying a first protective sheet on one or more partially-processed semiconductor devices, removing the first protective sheet and performing a semiconductor-processing operation on the one or more partially-processed semiconductor devices.

In some embodiments, the method further includes transporting the one or more partially-processed semiconductor devices with the applied first protective sheet, before removing the first protective sheet. In some embodiments, the method further includes packaging the one or more partially-processed semiconductor devices, after performing the semiconductor-processing operation on the one or more partially-processed semiconductor devices.

In some embodiments, the method includes applying a second protective sheet on or over the one or more partially-processed semiconductor devices, after performing the semiconductor-processing operation on the one or more partially-processed semiconductor devices, and removing the second protective sheet before packaging the one or more partially-processed semiconductor devices.

In some embodiments, performing a semiconductor-processing operation on the one or more semiconductor devices includes packaging the one or more partially-processed semiconductor devices. In some embodiments, performing a semiconductor-processing operation on the one or more semiconductor devices includes applying a coating on the one or more semiconductor devices.

In some embodiments, the first protective sheet has an adhesive over at least a portion of a first side of the first protective sheet, and the first side is applied on the one or more partially-processed semiconductor devices.

In some embodiments, removing the first protective sheet includes irradiating the protective sheet with UV light. In some embodiments, removing the first protective sheet includes removing undesired residue associated with the first protective sheet.

In some embodiments, applying the first protective sheet is performed in a first environment, and removing the first protective sheet is performed in a second environment, distinct from the first environment. In some embodiments, removing the first protective sheet and performing the semiconductor-processing operation on the one or more partially-processed semiconductor devices are performed in the same environment.

In some embodiments, applying the first protective sheet includes adhering the first protective sheet to one or more edges of a device carrier housing the one or more partially-processed semiconductor devices.

In some embodiments, the first protective sheet is made of a material that provides protection from static buildup. In some embodiments, the first protective sheet provides protection from light. In some embodiments, the first protective sheet is transparent. In some embodiments, the first protective sheet is made of a plastic material.

In some embodiments, the one or more partially-processed semiconductor devices include a plurality of MEMS devices. In some embodiments, the one or more partially-processed semiconductor devices include a plurality of un-encapsulated, wire-bonded die.

In some embodiments, the first protective sheet has an adhesive over at least a portion of a first side of the first protective sheet, and the first side is applied on the one or more partially-processed semiconductor devices.

In some embodiments, the first protective sheet is removed in part by irradiating the protective sheet with UV light. In some embodiments, the first protective sheet is removed along with undesired residue associated with the first protective sheet.

In some embodiments, the system further includes a device carrier housing the one or more partially-processed semiconductor devices, wherein the first protective sheet is applied in part by being adhered to one or more edges of the device carrier.

In some embodiments, the first protective sheet is made of a material that provides protection from static buildup. In some embodiments, the first protective sheet provides protection from light. In some embodiments, the first protective sheet is transparent. In some embodiments, the first protective sheet is made of a plastic material.

In some embodiments, the one or more partially-processed semiconductor devices include a plurality of un-encapsulated, wire-bonded die. In some embodiments, the one or more partially-processed semiconductor devices include a plurality of MEMS devices.

In some embodiments, a film-stretcher device is utilized to perform one or more operations of the method for protecting partially-processed electronic parts.

In accordance with some implementations, the present disclosure relates to a semiconductor processing system for protecting electronic parts including one or more partially-processed semiconductor devices and a first protective sheet applied on the one or more partially-processed semiconductor devices, the first protective sheet being subsequently removed, and a semiconductor-processing operation being performed on the one or more partially-processed semiconductor devices.

In some embodiments, the semiconductor processing system further includes a second protective sheet applied on the one or more partially-processed semiconductor devices after performance of the semiconductor-processing operation on the one or more partially-processed semiconductor devices, wherein the second protective sheet is subsequently removed before the one or more semiconductor devices are packaged.

In some embodiments, the semiconductor processing operation performed on the one or more semiconductor devices includes application of a coating on the one or more semiconductor devices.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed are methods, materials, devices, systems and the like, for protecting partially-processed semiconductor parts during transport. Although described in the context of partially-processed semiconductor parts, it will be understood that one or more features of the present disclosure can also provide protection for other electronic devices or components during transport.

Some industries require a higher level of quality control and performance from their microelectronic devices, including the medical industry and military. For example, these devices are often exposed to more moisture, heat, pressure or vibration than microelectronic devices in ordinary commercial applications. As a result, every stage of preparing such specialized devices requires additional care.

In some cases, additional stages of semiconductor processing are required for these specialized uses. For example, additional cleaning stages, bonding stages and/or coating stages may be needed to provide greater weather-proofing or shock absorption of semiconductor devices for these uses. These additional processing stages may need to be performed in an environment external to the fabrication plant or foundry. For example, un-encapsulated wire-bonded devices need a proprietary coating applied at another facility. In such cases the parts may need to be transported before they are protected by their final package material.

An intermediate form of protection is required to protect the partially-processed semiconductor devices while they are awaiting additional semiconductor processing, before they are finally packaged. This intermediate packaging protects the semiconductor devices from damage due to problems such as corrosion, stress fractures, thermal expansion or contraction, and/or delamination, to name just a few.

Currently, partially-processed semiconductor parts (e.g., parts that have been processed to some point before encapsulation or final packaging) that require additional processing stages, are individually protected by custom-sized metal caps with clips to hold the caps in place over a respective semiconductor part. Production of these custom caps is expensive, and time-consuming. In some cases the caps and clips are produced in separate facilities, adding further complication to this approach. These caps are typically manually attached to each individual semiconductor part, and removed individually, as well. As such, application of these caps is time-consuming, costly and prone to human error. In some cases, these caps do not form a perfect seal around each part, leaving the respective part vulnerable to contamination from organic or inorganic substances, oxidation or moisture.

Figure 1A:
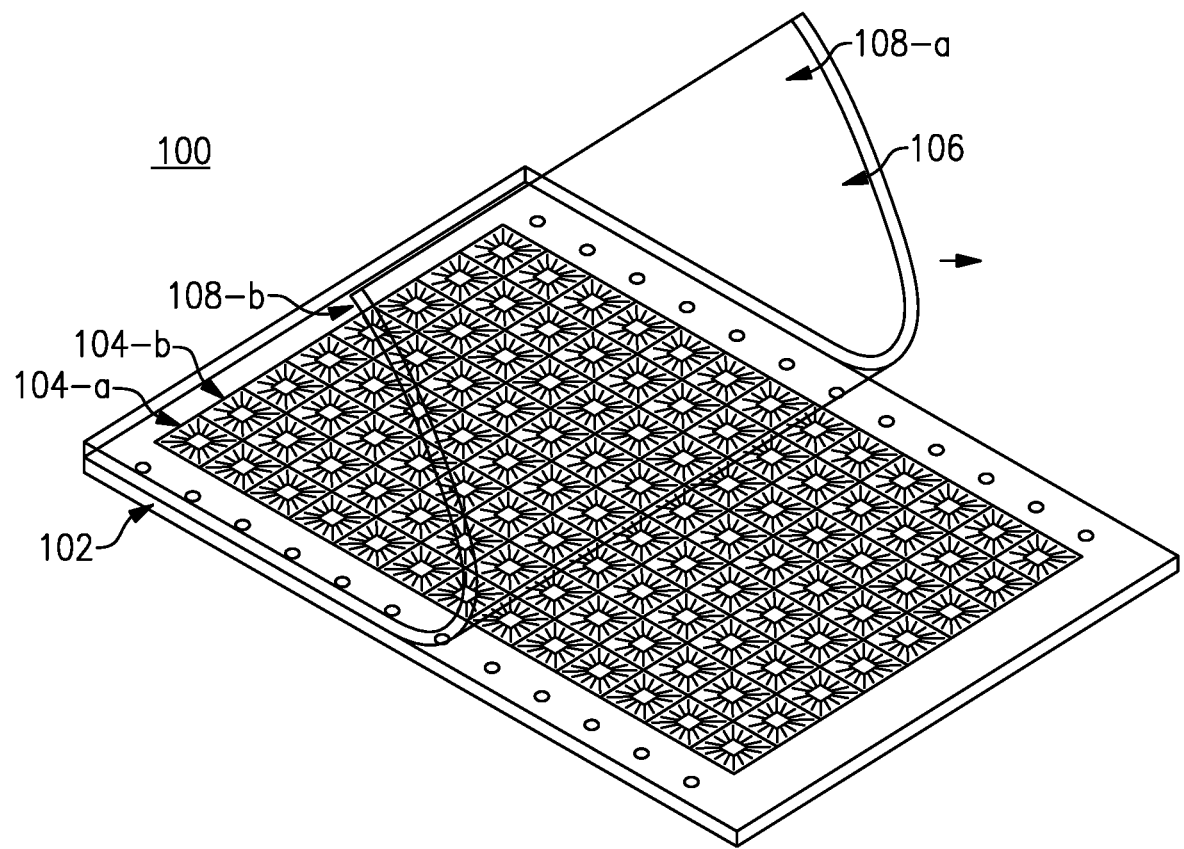
FIG. 1A shows a perspective view of a first exemplary semiconductor device protection system, designed to transport and protect partially-processed semiconductor parts according to some implementations.

FIG. 1A shows a perspective view of an exemplary semiconductor device protection system 100, designed to transport and protect partially-processed semiconductor parts 104 (e.g., semiconductor parts 104-*a* and 104-*b*). In some embodiments, the partially-processed semiconductor parts 104 include fully-processed die that have been partially packaged, such as un-encapsulated wire-bonded die attached to respective lead frames. For example, the individual die have been singulated from a fully processed semiconductor wafer, lifted onto respective lead frames, and bonded to those lead frames. In some embodiments, the partially-processed parts 104 include partially-processed die that have not undergone a full set of semiconductor processing operations, such as the application of passivation on flip-chip parts.

In some embodiments, semiconductor device protection system 100 includes a carrier 102, to hold one or more partially-processed semiconductor parts 104 (e.g., semiconductor parts 104-*a* and 104-*b*). In some embodiments, after processing the semiconductor parts 104 to the desired extent (e.g., partially-processed die or partially-packaged die), the parts are placed onto carrier 102 using known pick and place techniques. In some embodiments, carrier 102 is a product designed to transport the partially-processed semiconductor parts. In some embodiments, carrier 102 is a custom-made product specific to the one or more partially-processed semiconductor parts 104. For example, carrier 102 has one or more slots, cavities, openings or indentations to cradle one or more partially-processed semiconductor parts 104. In some embodiments, these slots, cavities, openings or indentations are custom-sized to the size of the one or more partially-processed semiconductor parts 104. In some embodiments, the partially-processed semiconductor parts 104 are equally-sized, while in some embodiments, the partially-processed semiconductor parts 104 are of two or more distinct sizes. In some embodiments, carrier 102 is an off-the-shelf, conventional carrier device. For example, in some embodiments, carrier 102 is similar to a gel pack, or waffle-tray carrier.

In some embodiments, carrier 102 is flexible, semi-flexible or rigid. For example, carrier 102 may exhibit film-like physical properties, with respect to flexibility, thickness, transparency and composition. In some embodiments, carrier 102 has a large degree of flexion, while in some embodiments, carrier 102 exhibits a small degree of flexion. In some embodiments, carrier 102 has an adhesive, rubbery or tacky surface that helps keep the one or more placed semiconductor parts 104 in place. While FIG. 1 depicts carrier 102 in a rectangular shape, it should be understood that this is only one example of the many possible shapes of carrier 102.

FIG. 1A also illustrates the application of an exemplary film 106, on carrier 102 and the one or more partially-processed semiconductor parts 104. In some embodiments, application of film 106 on carrier 102 and the one or more semiconductor parts 104 includes contact between film 106 and either or both of carrier 102 and semiconductor parts 104. In some cases, application of film 106 on carrier 102 and the one or more semiconductor parts 104 does not include contact between film 106 and some of carrier 102 and/or semiconductor parts 104 (e.g., film 106 is applied over carrier 102 and/or semiconductor parts 104). For example, application of film 106 on carrier 102 and/or semiconductor parts 104 means on or over carrier 102 and/or semiconductor parts 104. In some embodiments, film 106 is partially or entirely made of a plastic material. In some embodiments, film 106 has a first side 108-a and a second side 108-b, where first side 108a is in contact with semiconductor parts 104 and/or carrier 102. In some embodiments, film 106 is the same shape and size as carrier 102, while sometimes film 106 is larger than carrier 102 and overhangs the edges of carrier 102.

In some embodiments, film 106 is applied on carrier 102 manually, by placing film 106 over, or substantially over, carrier 102, then applying pressure on one or more locations, such as the edges of carrier 102. In some cases, film 106 is applied automatically, or mechanically, using the same application technique. This technique may, in some cases, include applying pressure with a tool such as a roller or clamper. Applying pressure to film 106 results, in some cases, in affixation of film 106 at the locations where pressure is applied. In some cases, affixation of film 106 occurs in locations even where no pressure is applied. Film 106 may be affixed to the side edges of carrier 102. Application of film 106 occurs, in some cases, in a clean-room environment, to minimize the contamination of the semiconductor parts 104. This may be the same clean-room environment used for other semiconductor processes undergone by semiconductor parts 104.

Figure 1B:
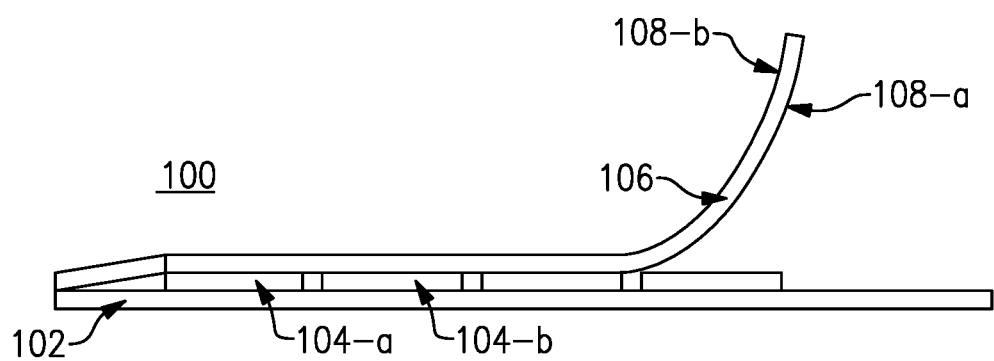
FIG. 1B shows a side sectional view of the application of film on or over the one or more semiconductor parts in the first exemplary semiconductor device protection system according to some implementations.

FIG. 1B shows a side sectional view of the application of film 106 on or over the one or more semiconductor parts 104. In the example shown in FIG. 1B, film 106 makes at least partial contact with the one or more semiconductor parts 104. In some embodiments, it is desired for film 106 to make as much contact as possible with semiconductor parts 104. In some embodiments, the application of film 106 on semiconductor parts 104 includes extracting as much air as possible from between film 106 and carrier 102 and/or semiconductor parts 104. For example, the majority of film 106 is applied on (e.g., on or over) carrier 102 and/or semiconductor parts 104, and air is vacuumed out from a small opening before film 106 is completely applied.

In some embodiments, first side 108a of film 106 has an adhesive coating to allow for film 106 to stick to carrier 102 and/or semiconductor parts 104. This adhesive may be selected to be minimally tacky, in order to provide enough stability to semiconductor parts 104, but not be too difficult to remove, or leaving behind too much residue.

FIG. 1A depicts un-encapsulated wire-bonded semiconductor devices as the exemplary semiconductor parts 104, but it should be understood that other types of semiconductor devices may be protected by system 100, such as MEMS devices, flip-chip parts, TAB bonded parts or unpackaged, singulated die. In some embodiments, semiconductor parts 104 are flexible, or are formed on a flexible substrate and/or chip frame including, but not limited to flexible modules, flexible films and flexible circuits.

System 100 can be used for any semiconductor device or part in an intermediate stage of processing, before it can safely be exposed to environmental elements such as dust, moisture, metallic residue or any other organic or inorganic contaminant. System 100 also provides a degree of shock absorption and protection from impact. In some embodiments, the qualities of film 106 depend on one or more factors, such as the nature of the semiconductor parts 104, the size and shape of carrier 102, the level of protection required, the type of protection required and duration of time the semiconductor parts 104 need protection. For example, a set of semiconductor parts 104 that need to be transported from a factory in Asia to a research facility in the US, may need a film 106 that provides more shock absorption and longer protection than a set of semiconductor parts 104 that needs to be transported from one room to another in the same building.

Film 106 may provide protection from light, for example for specialized optoelectronic semiconductor parts 104. In some cases, film 106 provides protection from UV light. Film 106 as a solid sheet, generally provides protection to semiconductor parts 104 from moisture and particles, but in some embodiments, film 106 is a perforated mesh that still provides protection from movement and impact but does not protect from contaminants. For example, to prevent the build-up of condensation, a perforated sheet film 106 may be applied over semiconductor parts 104 that can otherwise withstand exposure to contaminants.

Figure 2A:
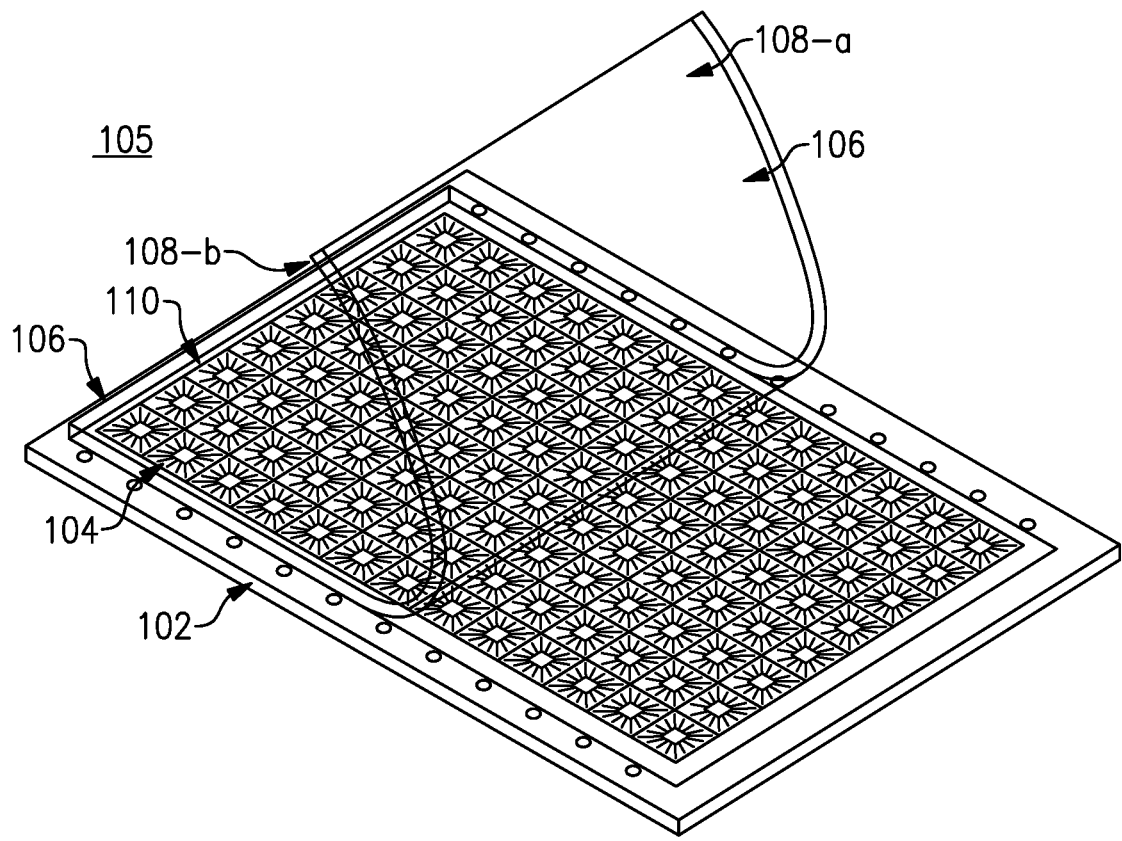
FIG. 2A shows a perspective view of a second exemplary semiconductor device protection system according to some implementations.

FIG. 2A shows a perspective view of another exemplary semiconductor device protection system 105. In system 105, carrier 102 has an adhesion ring 110, allowing for film 106 to adhere to adhesion ring 110, after application. In some embodiments, film 106 adheres to adhesion ring 110, in addition to at least some of carrier 102 and/or semiconductor parts 104.

Figure 2B:
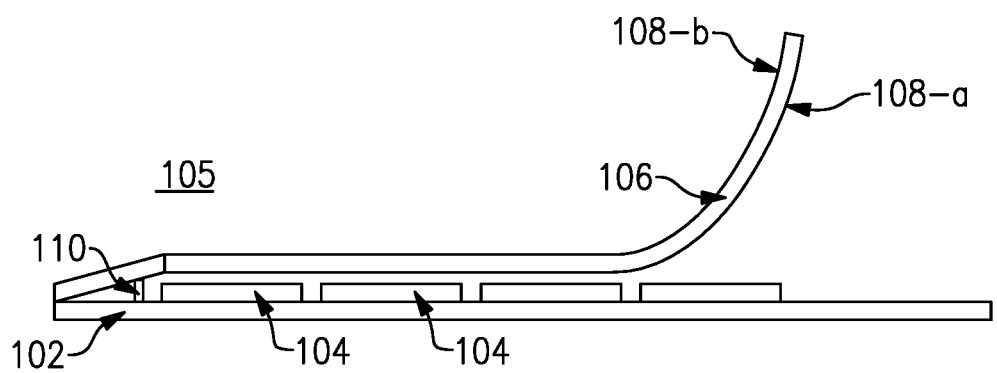
FIG. 2B shows a side sectional view of the application of a film on or over the one or more semiconductor parts in the second semiconductor device protection system according to some implementations.

FIG. 2B shows a side sectional view of the application of film 106 on or over the one or more semiconductor parts 104, in semiconductor device protection system 105. In FIG. 2B, film 106 is in contact with adhesion ring 110 (shown in cross section), and pulled taut over semiconductor parts 104 to avoid making contact with one or more semiconductor parts 104. After application is complete, film 106 may also make contact with adhesion ring 110 at various other locations, keeping it from making contact with any of semiconductor parts 104.

Although not shown in FIGS. 2A or 2B, semiconductor device protection system 105 may have another structure rather than an adhesion ring 110, to keep film 106 from making contact with semiconductor parts 104. For example, a set of posts surrounding semiconductor parts 104 could provide adequate contact points to keep adhesion film 106 taut. Another alternative structure is a ring with one or more gaps, while another possible structure is a pair of parallel rods running longitudinally along opposite edges of carrier 102. Regardless of the structure, the adhesion ring 110 or other embodiments of adhesion ring 110, have a height higher than the height of the tallest part of semiconductor parts 104. In some embodiments, the height of adhesion ring 110 is determined based on a sagginess quality of film 106 (e.g., based on rigidity and/or weight), and a distance from an opposing section of adhesion ring 110 (or an opposing support structure).

Figure 3A:
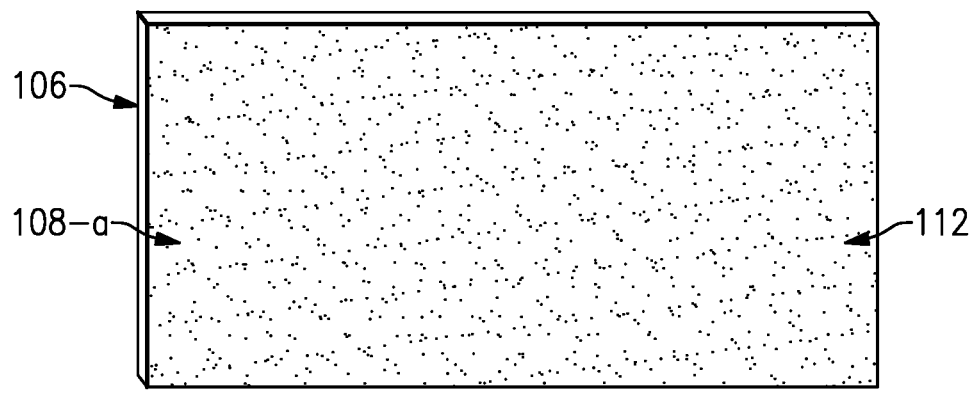
FIGS. 3A to 3C show exemplary embodiments of the first side of a film according to some implementations.
Figure 3B:
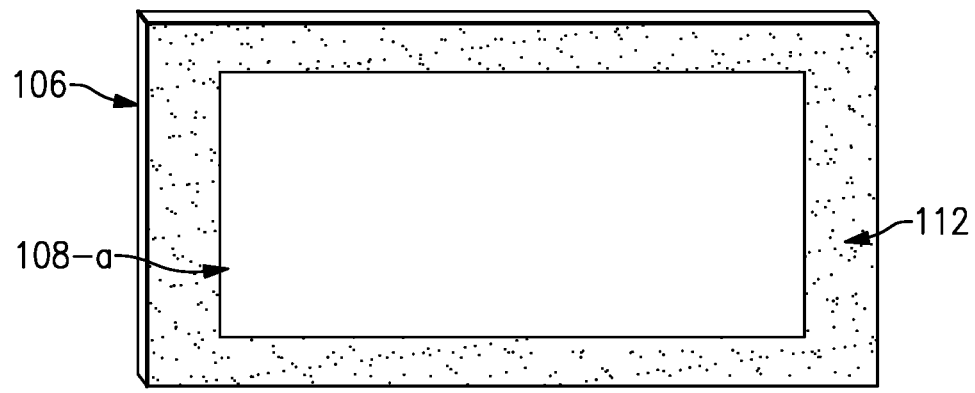
Figure 3C:
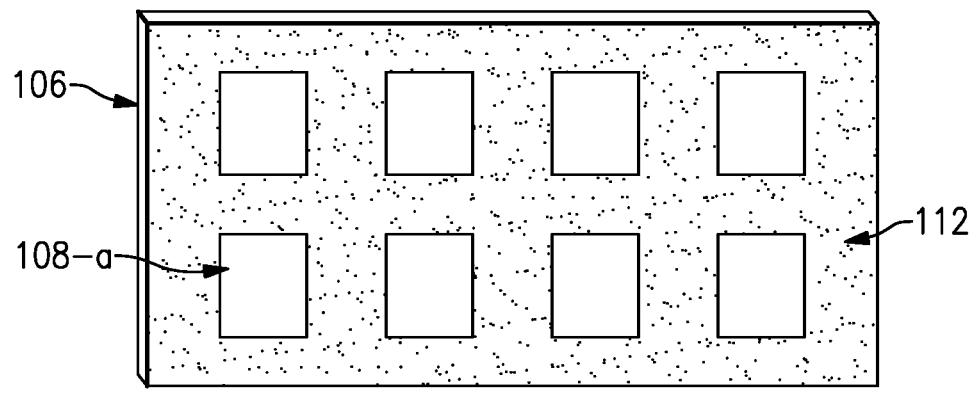

FIGS. 3A to 3C show exemplary embodiments of the first side 108a of film 106. FIG. 3A illustrates a film 106 with an adhesive 112 applied across all or substantially all of side 108a of film 106. In some embodiments having complete or nearly complete adhesion is desired, including adhesion to one or more semiconductor parts 104.

FIG. 3B illustrates a film 106 with an adhesive 112 applied around one or more edges of side 108a of film 106. For example, if it is desired to have film 106 adhere to the edges of carrier 102, and not adhere to the one or more semiconductor parts 104, an adhesion pattern as shown in FIG. 3B may achieve that. In some embodiments, an adhesion pattern such as the one shown in FIG. 3B is preferred, to allow for easier, or faster release of film 106.

FIG. 3C illustrates another, non-limiting example of an adhesion pattern for an adhesive 112 applied on side 108a of film 106. In FIG. 3C, adhesive 112 is applied in a grid pattern, but it should be understood that FIG. 3C represents any pattern involving a symmetrical or non-symmetrical use of areas on side 108a of film 106 with adhesive 112 and areas without adhesive 112. In some embodiments, a pattern of adhesive 112 across side 108a of film 106 is desired to provide substantially as much stability as film 106 of the example shown in FIG. 3A, but with the ability to release more easily.

Figure 4:
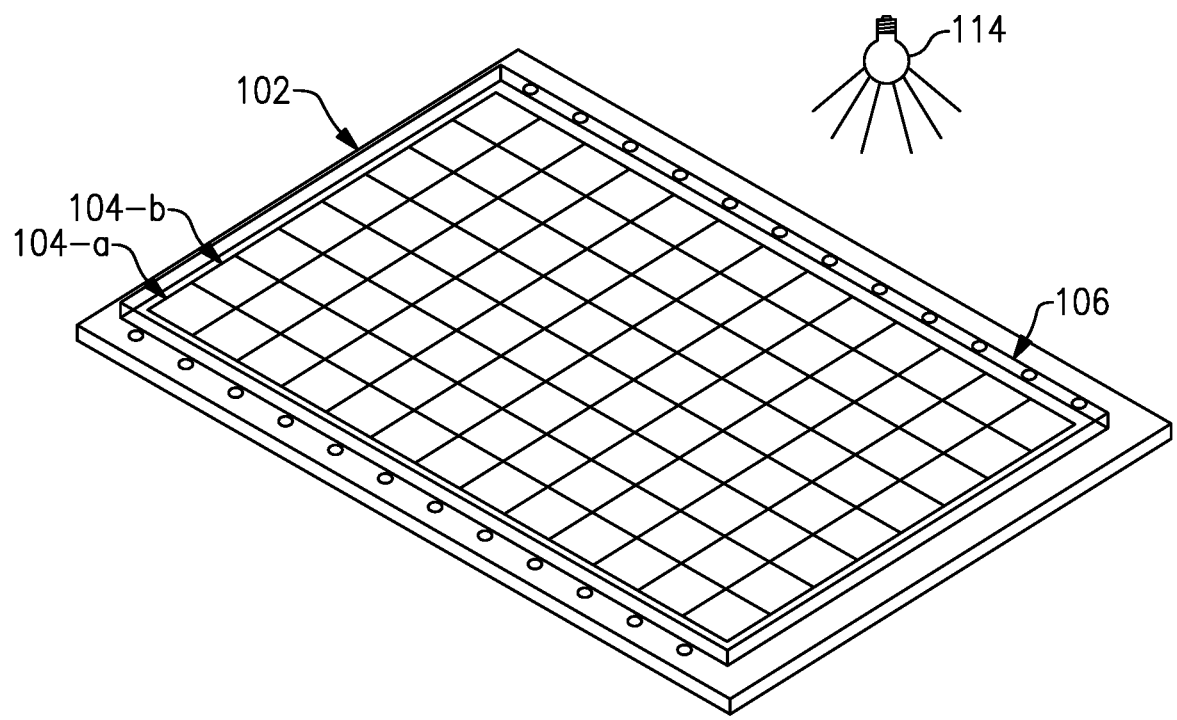
FIG. 4 shows an example of a semiconductor device protection and transportation system, with a film completely applied on one or more partially-processed semiconductor parts according to some implementations.

FIG. 4 shows an example of a semiconductor device protection and transportation system, with a film 106 completely applied on one or more partially-processed semiconductor parts 104 (e.g., semiconductor parts 104a and 104-b housed by carrier 102). For ease of visually depicting film 106 applied over the one or more semiconductor parts 104, the semiconductor parts 104 are not drawn as un-encapsulated wire-bonded parts, as in prior figures, but it should be understood that this is still one possible embodiment for semiconductor parts 104. In some embodiments, removal of film 106 requires a removal-processing step. For example, removal of film 106 requires application of light, heat or another type of energy. In another example, removal of film 106 requires placement of carrier 102 with the one or more semiconductor parts 104 and film 106 in a solution (e.g., a solution containing acetone), or in a special environment (e.g., a freezer or oven).

FIG. 4 also illustrates energy source 114 over carrier 102, semiconductor parts 104 and film 106. In some embodiments, energy source 114 emits UV radiation, which is used to help release film 106. For example, film 106 is held in place on top of carrier 102 and/or semiconductor parts 104 with an adhesive (e.g., adhesive 112 from FIGS. 3A-3C) that breaks down upon exposure to UV light. In some embodiments, energy source 114 provides heat, which is used to help release film 106. In some embodiments, one or more properties of film 106 differ, depending on the nature of energy source 114. For example, if energy source 114 provides UV radiation, film 106 is visibly transparent, or transparent to UV light, to allow the radiation to break down the adhesive of film 106. In another example, if energy source 114 provides heat, film 106 may change in color (e.g., from green to black) to indicate enough heat has been applied to remove the film before providing too much heat to the one or more semiconductor parts 104.

Figure 5:
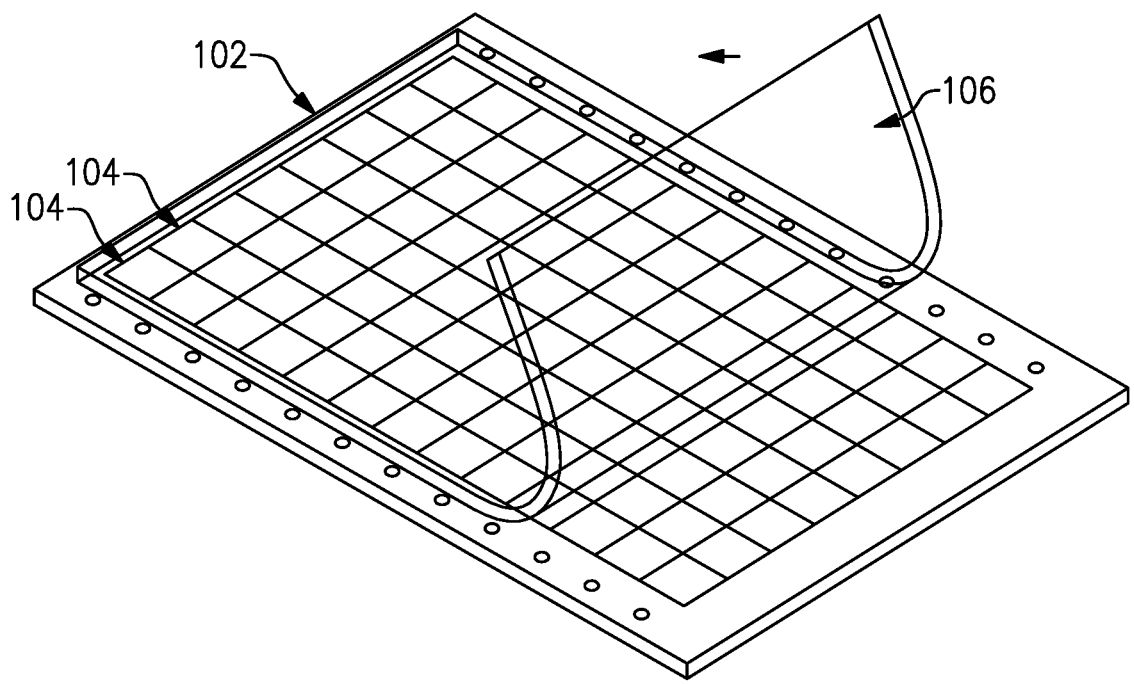
FIG. 5 shows an exemplary depiction of the removal of a film according to some implementations.

FIG. 5 shows an exemplary depiction of the removal of film 106. In some embodiments, film 106 can be peeled off of carrier 102 and/or semiconductor parts 104, when it is desired to remove film 106. Peeling can be performed manually, or by a machine. In some embodiments, removal of film 106 and/or performance of any removal-processing steps, take place in a clean room environment to prevent accumulation of contaminants on the partially-processed semiconductor parts 104.

In some embodiments, after removal of film 106, there is residual adhesive on carrier 102 and/or semiconductor parts 104, which must be removed. An additional step of removing undesired, residual adhesive may be performed. For example, the step may include swabbing the surfaces of carrier 102 or semiconductor parts 104 with an adhesive-removal solution, submerging carrier 102 and/or semiconductor parts 104 in a special solution or irradiating carrier 102 and/or semiconductor parts 104 with additional UV light.

Figure 6:
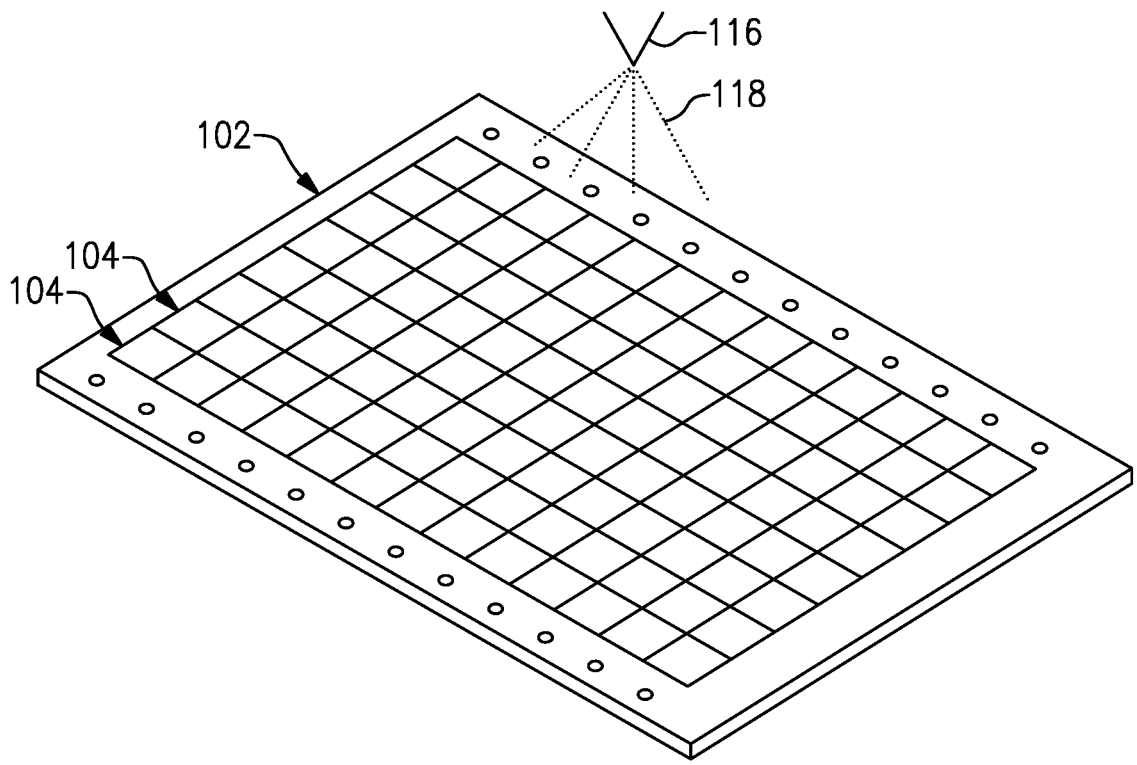
FIG. 6 illustrates performance of a semiconductor-processing operation, on one or more semiconductor parts, after removal of a protective film according to some implementations.

FIG. 6 illustrates performance of a semiconductor-processing operation, on one or more semiconductor parts 104, after removal of a protective film. The example shown in FIG. 6 involves application of a coating 118 on the one or more semiconductor parts 104. Although the example in FIG. 6 shows application of coating 118 through the use of a deposition tool 116, it should be understood that application of coating 118 can be performed by other means, including a vapor chamber, or application of the coating by contact with the one or more semiconductor parts 104 (e.g., swabbing or painting on the coating). In some embodiments, the semiconductor-processing operation (e.g., application of coating 118) is performed in a clean room environment. In some embodiments, the semiconductor-processing operation is performed in a specialized piece of equipment that also removes a protective film on carrier 102 and/or semiconductor parts 104, and optionally performs any removal-processing steps as well (e.g., emitting UV light to break down adhesive of film).

The application of coating 118 is simply one possible semiconductor-processing operation that can be performed after a protective film covering semiconductor parts 104, is removed. Some other non-limiting examples of semiconductor-processing operations that could be performed on semiconductor parts 104, include packaging, performing rework such as FIB operations, cleaning, etching, labeling, heat curing, molding, bonding or doping, to name a few. In some embodiments, two or more semiconductor-processing operations are performed on partially-processed semiconductor parts 104.

Figure 7:
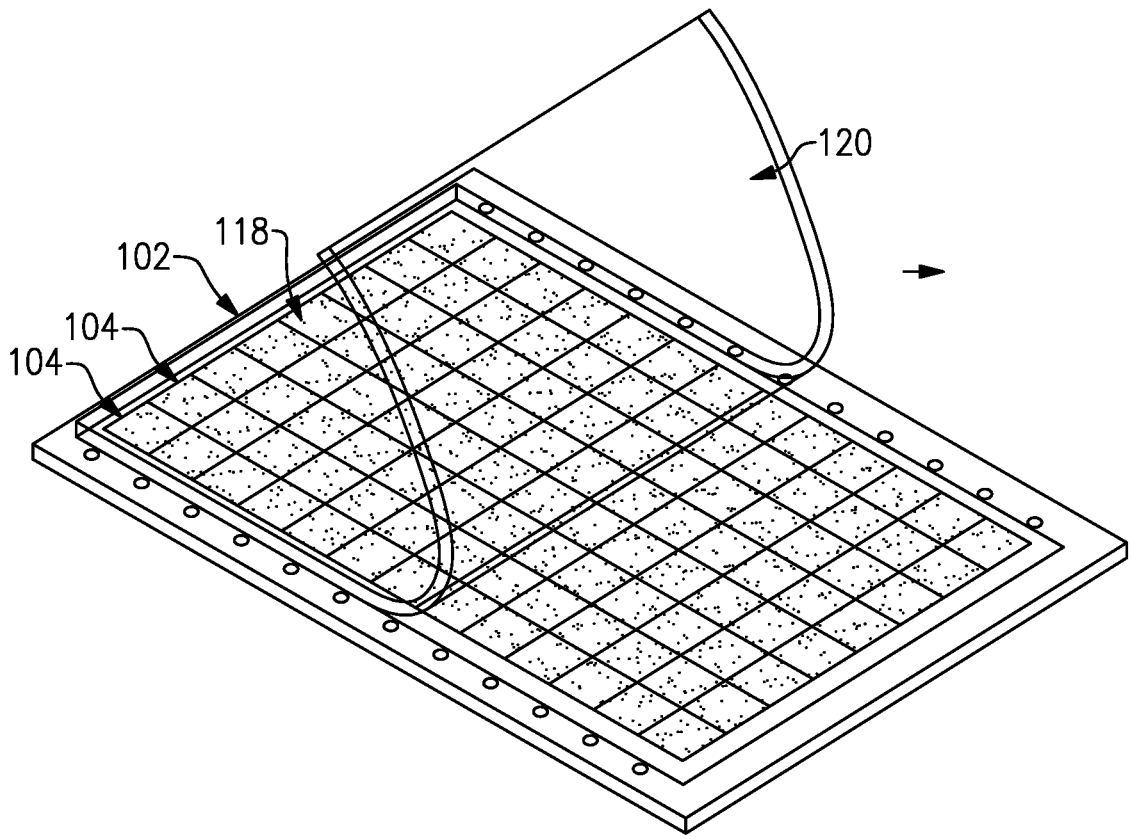
FIG. 7 illustrates the application of a second film, on semiconductor parts, after performance of one or more semiconductor-processing operations on the parts, according to some implementations.

FIG. 7 illustrates the application of a second film 120, on semiconductor parts 104, after performance of one or more semiconductor-processing operations on the parts. In the example shown in FIG. 7, semiconductor parts 104 have particles from coating 118 on their surfaces, before film 120 is applied on them. In some embodiments, application of second film 120 is not required because the semiconductor-processing operation or operations performed on semiconductor parts 104, render them protected from exposure to contaminants, thermal changes, moisture, shock and/or light (e.g., packaging of semiconductor parts 104). In some embodiments, application of second film 120 is performed in the same environment, or specialized piece of equipment as where removal of a protective film and/or performance of a semiconductor-processing operation is performed.

Figure 8:
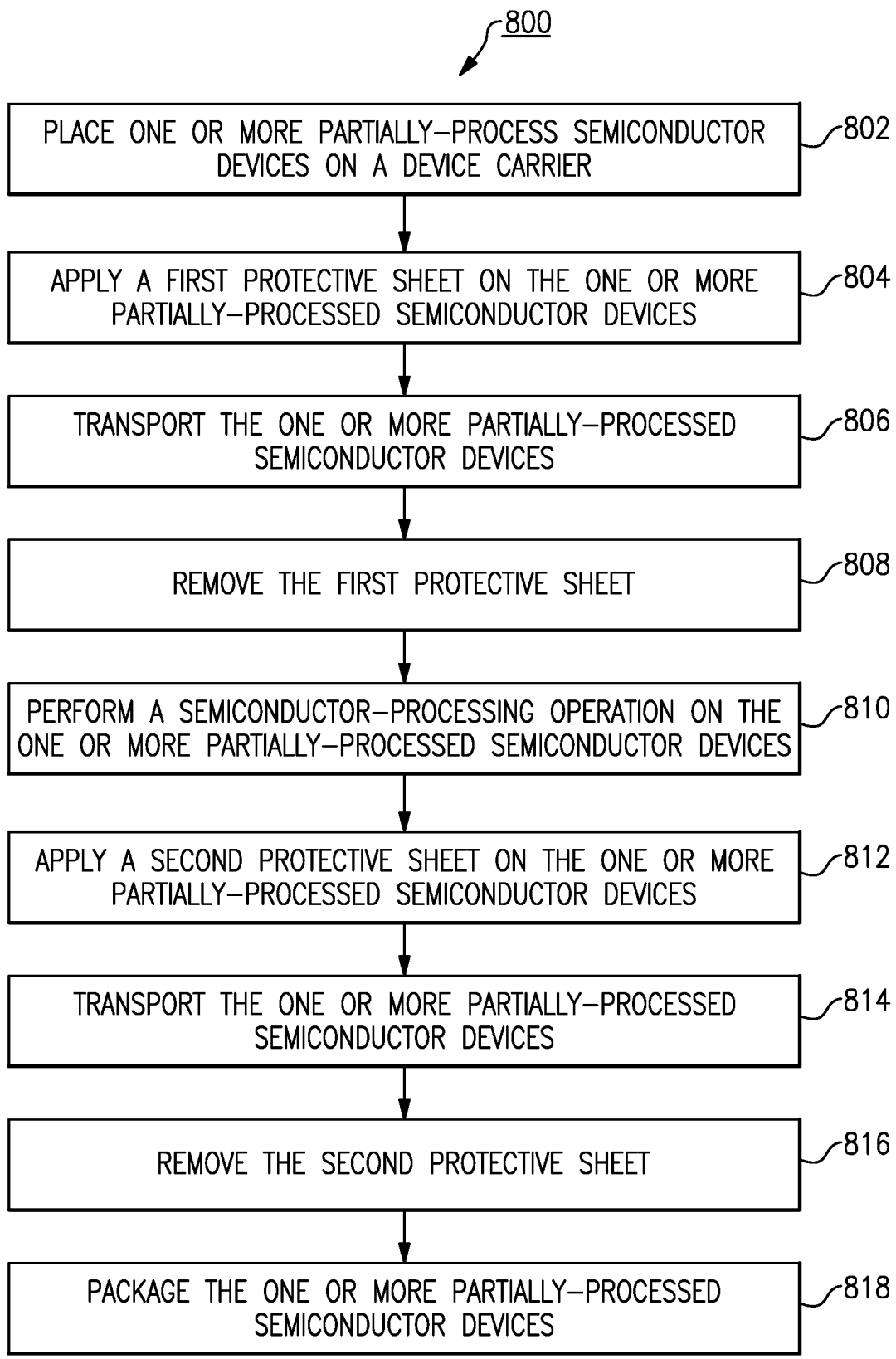
FIG. 8 represents an exemplary process for protecting partially-processed semiconductor devices in accordance with some implementations.

FIG. 8 represents an exemplary process 800 for protecting partially-processed semiconductor devices. Process 800 represents an exemplary, detailed technique for protecting partially-processed semiconductor devices, but it should be understood that one or more elements of process 800 are optional. In some embodiments, process 800 occurs at a specialized device for applying a protective sheet on a surface, such as a film-stretcher device.

In some embodiments, process 800 includes placing (802) one or more partially-processed semiconductor devices on a device carrier. For example, as can be seen in FIG. 1A, one or more semiconductor parts 104 are placed on device carrier 102. In some embodiments, this placing uses known techniques and tools for semiconductor device pick-and-place operations. In some embodiments, the semiconductor devices are manually placed, and in some embodiments the placing of the semiconductor devices is performed in a clean-room environment. In some embodiments the device carrier is flexible, semi-rigid or rigid. In some embodiments, the one or more partially-processed semiconductor devices are formed on a flexible substrate, chip-frame and/or leadframe. In some embodiments, a film-stretcher device is configured to receive the one or more partially-processed semiconductor devices on or in the device carrier.

Process 800 includes applying (804) a first protective sheet on the one or more partially-processed semiconductor devices. FIGS. 1A and 1B illustrate an example of one technique of application of protective sheet 106, on semiconductor parts 104. In some embodiments, the first protective sheet is applied so that it makes contact with one or more of the partially-processed semiconductor devices, while in some implementations, the first protective sheet does not make contact with any of the partially-processed semiconductor devices. It should be understood that in the context of this disclosure, application of the first protective sheet on the one or more partially-processed semiconductor parts includes, in some cases, application over the one or more partially-processed semiconductor parts. In some embodiments, a film-stretcher device is configured to apply the first protective sheet on the one or more partially-processed semiconductor devices.

The partially-processed semiconductor devices may include, for example, un-packaged parts such as wire-bonded parts that have been attached to lead frames but have not been encapsulated yet. Another example of partially-processed semiconductor devices is bare, singulated die. Another example of partially-processed semiconductor devices is a set of flip-chip die that have not been bumped, or have not had passivation applied to them yet. In some embodiments, the partially-processed semiconductor devices are modules, boards or other electronic devices with a mounted die. In some embodiments, the partially-processed semiconductor devices are flexible, and/or include flexible components such as flexible modules, flexible films and flexible circuits.

In some embodiments, a protective sheet has adhesive applied to one side, allowing it to remain applied on the one or more partially-processed semiconductor devices. In some embodiments, the adhesive sticks to the exposed devices. In some embodiments, there's a different adhesive over the exposed semiconductor devices and the edge of a device carrier holding the exposed semiconductor devices. In some embodiments, the adhesive loses tackiness over time so there is a time-limit to the protection and it releases more easily over time. In some embodiments, the adhesive is UV curable, and only adheres after being irradiated with UV light, so it can be stored in a non-tacky state. Alternatively, in some embodiments, the adhesive breaks down after exposure to UV light. In some embodiments, the adhesive is applied to the edge of the device carrier instead, and the sheet is rolled onto the sticky surface of the device carrier.

In some embodiments, a protective sheet used in process 800, is made of a material that provides protection from static buildup (e.g., an ESD safe material). In some embodiments, a protective sheet provides protection to the one or more partially-processed semiconductor devices, from light (e.g., visible light or non-visible light, such as UV light). In some embodiments, a protective sheet is transparent, for example to allow for UV light to pass through the sheet to break down the adhesive. In some embodiments, a transparent protective sheet is used for protecting partially-processed semiconductor devices as long as they are not light-sensitive. In some embodiments, a protective sheet of process 800 is made of a plastic material. For example, the material is plastic mixed with something else, like metal or another inorganic material.

In some cases, process 800 includes transporting (806) the one or more partially-processed semiconductor devices with the first protective sheet applied on them. For example, this transportation involves some shipping and handling, such as carrying the one or more semiconductor devices onto a van, packing the devices onto an airplane, then loaded into another ground transport vehicle after landing to be taken to a research facility, laboratory or factory. In any case, the one or more semiconductor devices need to be protected from shock, vibration, moisture, organic and inorganic contaminants and/or light, during the journey.

Process 800 includes removing (808) the first protective sheet, as shown in the example of FIG. 5, described above. In some embodiments, application and removal of a protective sheet occur in sterile or clean room environments. In some embodiments, the application of a protective sheet occurs in a first environment (e.g., a manufacturer in Asia), and the removal of a protective sheet occurs in a second environment, distinct from the first environment (e.g., a research facility in North America). In some embodiments, the first environment and second environment are the same, for example if the one or more partially-processed semiconductor devices are temporarily shelved after application of the first protective sheet, due to equipment failure for subsequent processing or packaging of the semiconductor devices.

In some embodiments, the removal of a protective sheet is performed in a manner to prevent imparting undue stress and contamination to the one or more partially-processed semiconductor parts. In some embodiments, one or more removal-processing steps are taken before removing a protective sheet, such as irradiating the protective sheet and the one or more semiconductor parts with UV light, as shown in FIG. 4. In some embodiments, steps are taken after removal of a protective sheet to remove remaining residue from an adhesive used to hold the protective sheet in place. In some embodiments, a protective sheet is produced in a specialized manner (e.g., in a sterile or clean-room environment) to ensure it is free of contamination and/or static charge.

Process 800 includes performing (810) a semiconductor-processing operation on the one or more partially-processed semiconductor devices. For example, this semiconductor-processing operation could include applying a proprietary coating over the one or more partially-processed semiconductor devices, or performing actions such as etching, rework, cleaning, testing, bonding, passivating or packaging the devices.

In some embodiments, process 800 includes applying (812) a second protective sheet on the one or more partially-processed semiconductor devices. In some embodiments, the second protective sheet has the same properties as the first protective sheet (e.g., it is also transparent or translucent or plastic-based). In some embodiments, the second protective sheet is the same sheet as the first protective sheet (i.e., it is reused).

In some embodiments, process 800 includes transporting (814) the one or more partially-processed semiconductor devices. In some embodiments, the parts are transported a very small distance (e.g., across a room or within a building), and in some embodiments, the parts are transported a large distance. In some embodiments, the one or more partially-processed semiconductor devices are transported to a different location from where the first protective sheet was applied, and/or where the first protective sheet was removed (e.g., to a customer site after processing). In some embodiments, if a second protective sheet was applied, process 800 includes removing (816) the second protective sheet. In some embodiments, the second protective sheet is applied for a different length of time than the first protective sheet. For example, the first protective sheet is applied for one hour, while the one or more partially-processed semiconductor devices are moved from one laboratory to another, but the second protective sheet is applied for one week while the one or more semiconductor devices travel to a foundry for final packaging.

In some embodiments, process 800 includes packaging (818) the one or more partially-processed semiconductor devices. For example, if the one or more partially-processed semiconductor devices are wire-bonded parts, they are encapsulated. In another example, the partially-processed semiconductor devices include flip-chip parts that are bumped. In some embodiments, performing (810) a semiconductor-processing operation on the one or more partially-processed semiconductor devices includes one or more aspects of packaging the devices. In some embodiments, packaging (818) the one or more semiconductor devices is performed before application of a second protective sheet.

For the purpose of description, it will be understood that the die 302 can include, for example, silicon (Si), gallium arsenide (GaAs), and silicon germanium (SiGe). Other types of semiconductor die can also be utilized.

In some implementations, a device (e.g., a partially-processed semiconductor device) having one or more features described herein can be included in an RF device such as a wireless device. Such a semiconductor device can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for protecting electronic parts, comprising:
applying a first protective sheet on one or more edges of a device carrier housing an array of singulated, partially-processed semiconductor devices that require one or more additional stages of semiconductor processing, the array including a plurality of rows and a plurality of columns, the first protective sheet including an adhesion pattern on a surface applied on the array of partially-processed semiconductor devices;

removing the first protective sheet; and performing a semiconductor-processing operation relating to the one or more additional stages on the array of partially-processed semiconductor devices housed in the device carrier, at least some of the partially-processed semiconductor devices in the array remaining housed in the device carrier during the semiconductor-processing operation, performing the semiconductor-processing operation on the array of partially-processed semiconductor devices including applying a coating on the array of partially-processed semiconductor devices.

2. The method of claim 1 further comprising transporting the array of partially-processed semiconductor devices with the applied first protective sheet before removing the first protective sheet.

3. The method of claim 1 further comprising packaging the array of partially-processed semiconductor devices after performing the semiconductor-processing operation on the array of partially-processed semiconductor devices.

4. The method of claim 3 further comprising:

applying a second protective sheet on or over the array of partially-processed semiconductor devices after performing the semiconductor-processing operation on the array of partially-processed semiconductor devices; and removing the second protective sheet before packaging the array of partially-processed semiconductor devices.

5. The method of claim 1 wherein performing the semiconductor-processing operation on the array of partially-processed semiconductor devices further includes packaging the array of partially-processed semiconductor devices.

6. The method of claim 1 wherein removing the first protective sheet includes irradiating the protective sheet with UV light.

7. The method of claim 1 wherein removing the first protective sheet includes removing undesired residue associated with the first protective sheet.

8. The method of claim 1 wherein applying the first protective sheet is performed in a first environment, and removing the first protective sheet is performed in a second environment distinct from the first environment.

9. The method of claim 1 wherein removing the first protective sheet and performing the semiconductor-processing operation on the array of partially-processed semiconductor devices are performed in a clean-room environment.

10. The method of claim 1 wherein the first protective sheet is made of a material that provides protection from static buildup.

11. The method of claim 1 wherein the first protective sheet provides protection from light.

12. The method of claim 1 wherein the array of partially-processed semiconductor devices includes a plurality of un-encapsulated, wire-bonded die.

13. The method of claim 1 wherein the array of partially-processed semiconductor devices includes a plurality of MEMS devices.

14. The method of claim 1 wherein the first protective sheet is transparent.

15. The method of claim 1 wherein the first protective sheet is made of a plastic material.

16. The method of claim 2 wherein transporting the array of partially-processed semiconductor devices with the applied first protective sheet includes moving the partially-processed semiconductor devices from a first environment to a second environment.

17. The method of claim 1 wherein the first protective sheet provides protection to the array of partially-processed semiconductor devices from one or more of movement, moisture, contaminants, and light.

* * * * *